US006727520B2

United States Patent
Morgan et al.

(10) Patent No.: US 6,727,520 B2
(45) Date of Patent: Apr. 27, 2004

(54) SPATIALLY MODULATED REFLECTOR FOR AN OPTOELECTRONIC DEVICE

(75) Inventors: Robert A. Morgan, Plymouth, MN (US); Eva M. Strzelecki, Plymouth, MN (US)

(73) Assignee: Honeywell International Inc., Morristown, NJ (US)

(*) Notice: Subject to any disclaimer, the term of this patent is extended or adjusted under 35 U.S.C. 154(b) by 98 days.

(21) Appl. No.: 09/751,423

(22) Filed: Dec. 29, 2000

(65) Prior Publication Data

US 2002/0085610 A1 Jul. 4, 2002

(51) Int. Cl.[7] ............................................... H01L 33/00
(52) U.S. Cl. ........................................... 257/98; 372/45
(58) Field of Search ................................ 257/98; 372/45

(56) References Cited

U.S. PATENT DOCUMENTS

| | | | |
|---|---|---|---|
| 4,317,085 A | 2/1982 | Brunham et al. | 372/50 |
| 4,466,694 A | 8/1984 | MacDonald | 385/37 |
| 4,660,207 A | 4/1987 | Svilans | 372/45 |
| 4,784,722 A | 11/1988 | Liau et al. | 156/649 |
| 4,885,592 A | 12/1989 | Kofol et al. | 343/753 |
| 4,901,327 A | 2/1990 | Bradley | 372/45 |
| 4,943,970 A | 7/1990 | Bradley | 372/45 |
| 4,956,844 A | 9/1990 | Goodhue et al. | 372/44 |
| 5,031,187 A | 7/1991 | Orenstein et al. | 372/50 |
| 5,034,958 A | 7/1991 | Kwon et al. | |
| 5,052,016 A | 9/1991 | Mahbobzadeh et al. | 372/96 |
| 5,056,098 A | 10/1991 | Anthony et al. | 372/45 |
| 5,062,115 A | 10/1991 | Thornton | 372/50 |
| 5,068,869 A | 11/1991 | Wang et al. | 372/45 |
| 5,115,442 A | 5/1992 | Lee et al. | 372/45 |
| 5,140,605 A | 8/1992 | Paoli et al. | 372/50 |
| 5,158,908 A | 10/1992 | Blonder et al. | 437/129 |
| 5,216,263 A | 6/1993 | Paoli | 257/88 |
| 5,216,680 A | 6/1993 | Magnusson et al. | 372/20 |
| 5,237,581 A | 8/1993 | Asada et al. | 372/45 |

(List continued on next page.)

FOREIGN PATENT DOCUMENTS

| | | |
|---|---|---|
| DE | 4 240 706 A | 6/1994 |
| EP | 0 288 184 A | 10/1988 |
| EP | 0 712 182 A2 | 5/1996 |
| EP | 0 776 076 A | 5/1997 |
| FR | 2 768 566 A1 | 3/1999 |
| JP | 60-123084 A | 7/1985 |
| JP | 02-054981 A | 2/1990 |
| JP | 5-299779 | 11/1993 |
| WO | WO 99/031735 A1 | 6/1999 |
| WO | WO 00/045483 A1 | 8/2000 |

OTHER PUBLICATIONS

International Search Report, dated Mar. 12, 2003, relative to PCT application No. PCT/US 01/50214, the foreign equivalent to the instant U.S. application 09/751,423.

(List continued on next page.)

Primary Examiner—Douglas Wille
(74) Attorney, Agent, or Firm—Andrew A. Abeyta

(57) ABSTRACT

Improved resonant reflectors are provided for increased mode control of optoelectronic devices. Some of the resonant reflectors provide improved mode control while not requiring significant additional processing steps, making them ideal for commercial applications. Other resonant reflectors reduce or eliminate abrupt changes in the reflectively of the resonant reflector across an optical cavity of an optoelectronic device, allowing them to reduce or eliminate undesirable diffraction effects that are common in many resonant reflectors.

25 Claims, 12 Drawing Sheets

U.S. PATENT DOCUMENTS

| | | | |
|---|---|---|---|
| 5,245,622 A | 9/1993 | Jewell et al. | 372/45 |
| 5,258,316 A | 11/1993 | Ackley et al. | |
| 5,258,990 A | 11/1993 | Olbright et al. | 372/46 |
| 5,285,466 A | 2/1994 | Tabatabaie | 372/92 |
| 5,293,392 A | 3/1994 | Shieh et al. | 372/45 |
| 5,317,170 A | 5/1994 | Paoli | 257/88 |
| 5,317,587 A | 5/1994 | Ackley et al. | 372/45 |
| 5,325,386 A | 6/1994 | Jewell et al. | 372/50 |
| 5,331,654 A | 7/1994 | Jewell et al. | 372/45 |
| 5,337,074 A | 8/1994 | Thornton | 346/107 R |
| 5,349,599 A | 9/1994 | Larkins | 372/50 |
| 5,351,256 A | 9/1994 | Schneider et al. | 372/45 |
| 5,359,447 A | 10/1994 | Hahn et al. | 359/154 |
| 5,359,618 A | 10/1994 | Lebby et al. | 372/45 |
| 5,363,397 A | 11/1994 | Collins et al. | 372/92 |
| 5,373,520 A | 12/1994 | Shoji et al. | 372/45 |
| 5,404,373 A | 4/1995 | Cheng | 372/50 |
| 5,416,044 A | 5/1995 | Chino et al. | 437/129 |
| 5,428,634 A | 6/1995 | Bryan et al. | 372/45 |
| 5,446,754 A | 8/1995 | Jewell et al. | 372/50 |
| 5,475,701 A | 12/1995 | Hibbs-Brenner | 372/50 |
| 5,513,202 A | 4/1996 | Kobayashi et al. | 372/96 |
| 5,530,715 A | 6/1996 | Shieh et al. | 372/96 |
| 5,555,255 A | 9/1996 | Kock et al. | 372/96 |
| 5,557,626 A | 9/1996 | Grodinski et al. | 372/45 |
| 5,561,683 A | 10/1996 | Kwon | 372/96 |
| 5,568,499 A | 10/1996 | Lear | 372/45 |
| 5,574,738 A | 11/1996 | Morgan | |
| 5,598,300 A | 1/1997 | Magnusson et al. | 359/566 |
| 5,606,572 A | 2/1997 | Swirhun et al. | 372/96 |
| 5,642,376 A | 6/1997 | Olbright et al. | 372/45 |
| 5,727,013 A | 3/1998 | Botez et al. | 372/96 |
| 5,774,487 A | 6/1998 | Morgan | 372/45 |
| 5,778,018 A | 7/1998 | Yoshikawa et al. | 372/45 |
| 5,818,066 A | 10/1998 | Duboz | 257/21 |
| 5,838,715 A | 11/1998 | Corzine et al. | 667/259 |
| 5,903,590 A | 5/1999 | Hadley et al. | 372/96 |
| 5,940,422 A * | 8/1999 | Johnson | 372/45 |
| 5,978,401 A | 11/1999 | Morgan | 372/50 |
| 6,026,111 A | 2/2000 | Jiang et al. | |
| 6,055,262 A | 4/2000 | Cox et al. | 372/96 |
| 6,078,601 A | 6/2000 | Smith | |
| 6,144,682 A | 11/2000 | Sun | |
| 6,185,241 B1 | 2/2001 | Sun | |
| 6,238,944 B1 | 5/2001 | Floyd | |
| 6,411,638 B1 | 6/2002 | Johnson et al. | |

OTHER PUBLICATIONS

Banwell et al., "VCSE Laser Transmitters for Parallel Data Links", *IEEE Journal of Quantum Electronics*, vol. 29, No. 2, Feb. 1993, pp. 635–644.

Catchmark et al., "High Temperature CW Operation of Vertical Cavity Top Surface–Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83–120.

Choa et al., "High–Speed Modulation of Vertical–Cavity Surface–Emitting Lasers", *IEEE Photonics Technology Letter*, vol. 3, No. 8, Aug. 1991, pp. 697–699.

G. G. Ortiz, et al., "Monolithic Integration of In0.2 GA0.8As Vertical Cavity Surface–Emitting Lasers with Resonance–Enhanced Quantum Well Photodetectors", *Electronics Letters*, vol. 32, No. 13, Jun. 20, 1996, pp. 1205–1207.

Graf, Rudolph, *Modern Dictionary of Electronics*, $6^{th}$ ed., Indiana: Howard W. Sams & Company, 1984, p. 694.

Jewell et al., "Surface Emitting Microlasers for Photonic Switching & Intership Connections", *Optical Engineering*, vol. 29, No. 3, pp. 210–214, Mar. 1990.

Jewell et al., "Surface–Emitting Microlasers for Photonic Switching and Interchip Connections", *Optical Engineering*, vol. 29, No. 3, Mar. 1990, pp. 210–214.

Kishino et al., "Resonant Cavity–Enhanced (RCE) Photodectors", *IEEE Journal of Quantum Electronics*, vol. 27, No. 8, pp. 2025–2034.

Kuchibhotla et al., "Low–Voltage High Gain Resonant Cavity Avalanche Photodiode", *IEEE Phototonics Technology Letters*, vol. 3, No. 4, pp. 354–356.

Lai et al., "Design of a Tunable GaAs/AlGaAs Multiple–Quantum–Well Resonant Cavity Photodector", *IEEE Journal of Quantum Electronics*, vol. 30, No. 1, pp. 108–114.

Lee et al., "Top–Surface Emitting GaAs Four–Quantum–Well Lasers Emitting at 0.85 $\mu$m", *Electronics Letters*, vol. 24, No. 11, May 24, 1990, pp. 710–711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251–1252.

Miller et al., "Optical Bistability Due to Increasing Absorption", *Optics Letters*, vol. 9, No. 5, May 1984, pp. 162–164.

Morgan et al., "200 $C_9$ 96–nm Wavelength Range, Continuous–Wave Lasing from Unbonded GaAs MOVPE–Grown Vertical Cavity Surface–Emitting Lasers", *IEEE Photonics Technology Letters*, vol. 7, No. 5, May 1995, pp. 441–443.

Jiang et al., "High–Frequency Polarization Self–Modulation in Vertical–Cavity Surface–Emitting Lasers", *Appl. Phys. Letters*, vol. 63, No. 26, Dec. 27, 1993, pp. 2545–2547.

Morgan et al., "High–Power Coherently Coupled 8×8 Vertical Cavity Surface Emitting Laser Array", *Appl. Phy Letters*, vol. 61, No. 10, Sep. 7, 1992, pp. 1160–1162.

Morgan et al., "Hybrid Dielectric/AlGaAs Mirror Spatially Filtered Vertical Cavity Top–Surface Emitting Laser", *Appl. Phys. Letters*, vol. 66, No. 10, Mar. 6, 1995, pp. 1157–1159.

Morgan et al., "Novel Hibrid–DBR Single–Mode Controlled GaAs Top–Emitting VCSEL with Record Low Voltage", 2 pages, dated prior to Dec. 29, 2000.

Morgan et al., "Progress and Properties of High–Power Coherent Vertical Cavity Surface Emitting Laser Arrays", *SPIE*, Vo. 1850, Jan. 1993, pp. 100–108.

Morgan et al., "Progress in Planarized Vertical Cavity Surface Emitting Laser Devices and Arrays", *SPIE*, vol. 1562, Jul. 1991, pp. 149–159.

Morgan et al., "Submilliamp Low–Resistance, Continuous–Wave, Single–Mode GaAs Planar Vertical–Cavity Surface Emitting Lasers", Honeywell Technology Center, Jun. 6, 1995.

Morgan et al., "Transverse Mode Control of Vertical–Cavity Top–Surface Emitting Lasers", *IEEE Photonics Technology Letters*, vol. 4, No. 4, Apr. 1993, pp. 374–377.

Morgan et al., "Vertical Cavity Surface Emitting Laser Arrays: Come of Age," Invited paper, *SPIE*, vol. 2683–04, OE LASE 96; Photonics West: Frabrication, Testing and Reliablity of Semiconductor Lasers, (SPIE<Bellingham, WA, 1996).

Morgan et al., "Vertical–Cavity Surface–Emitting Laser Arrays" *SPIE*, vol. 2398, Feb. 1995, pp. 65–93.

Morgan "High–Performance, Producible Vertical Cavity Lasers for Optical Interconnects", *High Speed Electronics and Systems*, vol. 5, No. 4, Dec. 1994, pp. 65–95.

Morgan, "Transverse Mode Control of Vertical–Cavity Top–Surface Emitting Lasers", *IEEE Phot. Tech. Lett.,* vol. 4, No. 4., p. 374, Apr. 1993.

Nugent et al., "Self–Pulsations in Vertical–Cavity Surface–Emitting Lasers", *Electronic Letters,* vol. 31, No. 1, Jan. 5, 1995, pp. 43–44.

U.S. patent application Ser. No. 09/751,422, filed Dec. 29, 2000, entitled "Resonant Reflector for Use with Optoelectronic Devices".

Guenter et al., "Reliability of Proton–Implanted VCSELs for Data Communications", Invited paper, *SPIE,* vol. 2683, OE LASE 96; Photonics West, Fabrication, Testing and Reliability of Semiconductor Lasers, (SPIE, Bellingham, WA, 1996).

Hibbs–Brenner et al., "Performance, Uniformity and Yield of 850nm VCELs Deposited by MOVPE", *IEEE Phot. Tech. Lett.,* vol. 8, No. 1, pp. 7–9, Jan. 1996.

Hornak et al., "Low–Temperature (10K–300K) Characterization of MOVPE–Grown Vertical–Cavity Surface–Emitting Lasers", *Photon. Tech. Lett.,* vol. 7, No. 10, pp. 1110–1112, Oct. 1995.

Huffaker et al., "Lasing Characteristics of Low Threshold Microcavity Layers Using Half–Wave Spacer Layers and Lateral Index Confinement", *Appl. Phys. Lett.,* vol. 66, No. 14, pp. 1723–1725, Apr. 3, 1995.

K.L. Lear et al., "Selectivity Oxidized Vertical Cavity Surface–Emitting Lasers with 50% Power Conversion Efficiency", *Elec. Lett.,* vol. 31, No. 3 pp. 208–209, Feb. 2, 1995.

Lehman et al., "High Frequency Modulation Characteristics of Hybrid Dielectric/AlGaAs Mirror Singlemode VCSELs", *Electronic Letters,* vol. 31, No. 15, Jul. 20, 1995, pp. 1251–1252.

Magnusson, "Integration of Guided–Mode Resonance Filters and VCSELs", Electo–Optics Research Center, Department of Electrical Engineering, University of Texas at Arlington, May 6, 1997.

Morgan et al., "Hybrid Dielectric/AlGaAs Mirror Spatially–Filtered Vertical Top–Surface Emitting Laser", *Appl. Phys. Lett.,* vol. 60, No. 8, pp. 921–923, Feb. 24, 1992.

Morgan et al., "One Watt Vertical Cavity Surface Emitting Laser", *Electron. Lett.,* vol. 29, No. 2, pp. 206–207, Jan. 21, 1993.

Morgan et al., "Producible GaAs–based MOVPE–Grown Vertival–Cavity Top–Surface Emitting Lasers wth Record Performance", *Elec. Lett.,* vol. 31, No. 6, pp. 462–464, Mar. 16, 1995.

Morgan et al., "Spatial–Filtered Vertical–Cavity Top Surface–Emitting Lasers", CLEO, 1993, pp. 138–139.

Morgan et al., "Vertical Cavity Surface Emitting Laser Arrays: Come of Age," , Invited paper, *SPIE,* vol. 2683–04, OE LASE 96; Photonics West: Frabrication, Testing and Relablity of Semiconductor Lasers, (SPIE>Bellingham, WA, 1996).

S.S. Wang and R. Magnusson, "Multilayer Waveguide–Grating Filters", *Appl. Opt.,* vol. 34, No. 14, pp. 2414–2420, 1995.

S.S. Wang and R. Magnusson, "Theory and Applications of Guided–Mode Resonance Filters", *Appl. Opt.,* vol. 32, No. 14, pp. 2606–2613, 1993.

Schubert, "Resonant Cavity Light–Emitting Diode", *Appl. Phys. Lett.,* vol. 60, No. 8, pp. 921–923, Feb. 24, 1992.

Y. M. Yang et al., "Ultralow Threshold Current Vertical Cavity Surface Emitting Lasers Obtained with Selective Oxidation", *Elect. Lett.,* vol. 31, No. 11, pp. 886–888, May 25, 1995.

Yablonovitch et al., "Photonic Bandgap Structures", *J. Opt. Soc. Am. B.,* vol. 10, No. 2, pp. 283–295, Feb. 1993.

Young et al., "Enhanced Performance of Offset–Gain High Barrier Vertical–Cavity Surface–Emitting Lasers", *IEEE J. Wuantum Electron.,* vol. 29, No. 6, pp. 2013–2022, Jun. 1993.

Smith, R.E. et al., Polarization–Sensitive Subwavelength Antireflection Surfaces on a Semiconductor for 975 NM, *Optics Letters,* vol. 21, No. 15, Aug. 1, 1996, pp. 1201–1203.

Suning Tang et al., "Design Limitations of Highly Parallel Free–Space Optical Interconnects Based on Arrays of Vertical Cavity Surface–Emitting Laser Diodes, Microlenses, and Photodetectors", Journal of Lightwave Technology, vol. 12, No. 11, Nov. 1, 1994, pp. 1971–1975.

Cox, J. A., et al., "Guided Mode Grating Resonant Filters for VCSEL Applications", *Proceedings of the SPIE,* The International Society for Optical Engineering, Diffractive and Holographic Device Technologies and Applications V, San Jose, California, Jan. 28–29, 1998, vol. 3291, pp. 70–71.

Martinsson et al., "Transverse Mode Selection in Large–Area Oxide–Confined Vertical–Cavity Surface Emitting Lasers Using a Shallow Surface Relief", *IEEE Photon, Technol. Lett.*, 11(12), 1536–1538 (1999).

Choquette et al., "Lithographically–Defined Gain Apertures Within Selectively Oxidized VCSELs", paper CtuL6, Conference on Lasers and Electro–Optics, San Francisco, California (2000).

Oh, T. H. et al., "Single–Mode Operation in Antiguided Vertical–Cavity Surface–Emitting Laser Using a Low–Temperature Grown AlGaAs Dielectric Aperture", *IEEE Photon. Technol. Lett,* 10(8), 1064–1066 (1998).

"Surface–Emitting Microlasers for Photonic Switching and Interchip Connections", *Optical Engineering,* 29, pp. 210–214, Mar. 1990.

G. Shtengel et al., "High–Speed Vertical–Cavity Surface–Emitting Lasers", *Photon. Tech. Lett.,* vol. 5, No. 12, pp. 1359–1361 (Dec. 1993).

* cited by examiner

SPATIALLY MODULATED REFLECTOR FOR AN OPTOELECTRONIC DEVICE

BACKGROUND OF THE INVENTION

This invention relates to the field of optoelectronic devices, and more particularly to resonant reflectors for optoelectronic devices.

Conventional semiconductor lasers have found widespread use in modem technology as the light source of choice for various devices, e.g., communication systems, laser printers, compact disc players, and so on. For many of these applications, a semiconductor laser is coupled to a semiconductor receiver (e.g., photodiode) through a fiber optic link or even free space. This configuration may provide a high speed communication path. Lasers that have a single or reduced mode output are particularly suitable for many of these applications because, among other things, they can provide a small spot size.

A typical edge-emitting semiconductor laser is a double heterostructure with a narrow bandgap, high refractive index layer surrounded on opposed major surfaces by wide bandgap, low refractive index layers. The low bandgap layer is termed the "active layer", and the bandgap and refractive index differences serve to confine both charge carriers and optical energy to the active layer or region. Opposite ends of the active layer have mirror facets which form the laser cavity. The cladding layers have opposite conductivity types and when current is passed through the structure, electrons and holes combine in the active layer to generate light.

Another type of semiconductor laser which has come to prominence in the last decade are surface emitting lasers. Several types of surface emitting lasers have been developed. One such laser of special promise is termed a "vertical cavity surface emitting laser" (VCSEL). (See, for example, "Surface-emitting microlasers for photonic switching and interchip connections", *Optical Engineering*, 29, pp. 210–214, March 1990, for a description of this laser). For other examples, note U.S. Pat. No. 5,115,442, by Yong H. Lee et al., issued May 19, 1992, and entitled "Top-emitting Surface Emitting Laser Structures", which is hereby incorporated by reference, and U.S. Pat. No. 5,475,701, issued on Dec. 12, 1995 to Mary K. Hibbs-Brenner, and entitled "Integrated Laser Power Monitor", which is hereby incorporated by reference. Also, see "Top-surface-emitting GaAs four-quantum-well lasers emitting at 0.85 $\mu$m", *Electronics Letters*, 26, pp. 710–711, May 24, 1990.)

Vertical Cavity Surface Emitting Lasers offer numerous performance and potential producibility advantages over conventional edge emitting lasers. These include many benefits associated with their geometry, such as amenability to one- and two-dimensional arrays, wafer-level qualification, and desirable beam characteristics, typically circularly-symmetric low-divergence beams.

VCSELs typically have an active region with bulk or one or more quantum well layers. On opposite sides of the active region are mirror stacks which are typically formed by interleaved semiconductor layers having properties, such that each layer is typically a quarter wavelength thick at the wavelength (in the medium) of interest thereby forming the mirrors for the laser cavity. There are opposite conductivity type regions on opposite sides of the active region, and the laser is typically turned on and off by varying the current through the active region.

High-yield, high performance VCSELs have been demonstrated, and exploited in commercialization. Top-surface-emitting AlGaAs-based VCSELs are producible in a manner analogous to semiconductor integrated circuits, and are amenable to low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) giving very high device yields.

VCSELs are expected to provide a performance and cost advantages in fast (e.g., Gbits/s) medium distance (e.g., up to approximately 1000 meters) single or multi-channel data link applications, and numerous optical and/or imaging applications. This results from their inherent geometry, which provides potential low-cost high performance transmitters with flexible and desirable characteristics.

Most VCSELs of practical dimensions are inherently multi (transverse) mode. Single lowest-order mode VCSELs are favored for coupling into single-mode fibers, and are advantageous for free-space and/or wavelength sensitive systems, and may even be beneficial for use in extending the bandwidth-length product of standard 50 $\mu$m and 62.5 $\mu$m GRIN multi-mode fiber. However, it has long been known that, although the short optical cavity ($2\lambda$) of the VCSEL favors single longitudinal mode emission, the multi-wavelength ($110\lambda$) lateral dimensions facilitate multi-transverse mode operation.

Higher order modes typically have a greater lateral concentration of energy away from the center of the optical or lasing cavity. Thus, the most obvious way to force the laser to oscillate in only a lowest order circularly symmetric mode is to make the lateral dimension of the active area small enough to prevent higher-order modes from reaching threshold. However, this necessitates lateral dimensions of less than about 5 $\mu$m for typical VCSELs. Such small areas may result in excessive resistance, and push the limits obtainable from conventional fabrication methodologies. This is particularly true for implantation depths of greater than about 1 $\mu$m, where lateral straggle may become a limiting factor. Thus, control of transverse modes remains difficult for VCSEL's of practical dimensions.

One approach for controlling transverse modes in VCSELs is suggested in U.S. Pat. No. 5,903,590 to Hadley et al. Hadley et al. suggest providing a mode control region that extends around the optical cavity of the VCSEL. The mode control region provides a different optical cavity length than the optical cavity length near the center of the VCSEL. This helps reduce the reflectivity in the mode control region. A limitation of Hadley et al. is that the mode control region is formed after the central optical cavity, which adds significant processing steps and increases the cost of the device. In addition, there is an abrupt change in the reflectivity between the mode control region and the optical cavity. This abrupt change can cause diffraction effects, which can reduce the efficiency as well as the quality of the VCSEL.

SUMMARY OF THE INVENTION

The present invention overcomes many of the disadvantages of the prior art by providing a resonant reflector that increases mode control while not requiring a significant amount of additional processing steps. Some resonant reflectors of the present invention also reduce or eliminate abrupt changes in the reflectively across the resonant reflector. This may reduce undesirable diffraction effects that are common in many resonant reflectors, particularly those used for mode control of optoelectronic devices.

In one illustrative embodiment of the present invention, a resonant reflector is provided on top of a top mirror layer of an optoelectronic device. In forming the resonant reflector, a first material layer is provided over the top mirror layer. The first material layer is then patterned, preferably by etching away the first material layer in the region or regions circumscribing the desired optical cavity of the optoelectronic device. A second material layer is then provided over the first material layer. The second material layer is preferably provided over both the etched and non-etched regions of the first material layer, but may only be provided over the non-etched regions, if desired.

In a related embodiment, the top mirror layer of the optoelectronic device may function as the first material layer discussed above. Thus, the top mirror layer may be patterned, preferably by etching at least partially into the top mirror layer in the region or regions circumscribing the desired optical cavity of the optoelectronic device. In one embodiment, the layer below the top mirror layer may function as an etch stop layer. Then, a second material layer is provided over the top mirror layer. The second material layer is preferably provided over both the etched and non-etched regions of the top mirror layer, but may only be provided over the non-etched regions, if desired.

The first material layer (or top mirror layer in an alternative embodiment) preferably has a refractive index that is less than the refractive index of the second material layer, and the first and second material layers preferably have a refractive index that is less than the refractive index of the top mirror layer (or next layer down in the alternative embodiment) of the optoelectroni device. This causes a reduction in the reflectivity of the resonant reflector in those regions tha correspond to the etched regions of the first material layer (or top mirror layer). The differenc in reflectivity can be used to provide mode control for optoelectronic devices.

In another illustrative embodiment of the present invention, a resonant reflector is formed by etching down but not all the way through one or more of the top mirror layers of an optoelectronic device. The etched region preferably circumscribes the desired optical cavity of the optoelectronic device, and has a depth that causes a phase shift that reduces the reflectivity of the resonant reflector at the desired operating wavelength, such as a depth that corresponds to an odd multiple of $\lambda/4$. To provide further differentiation, a cap mirror having one or more additional layers may be provided on selected non-patterned regions of the top mirror layer, such as over the desired optical cavity of the optoelectronic device. A metal layer may be provided on selected patterned regions of the top mirror layer. The metal layer may function as a top contact layer.

In yet another illustrative embodiment of the present invention, a resonant reflector is provided that has a refractive index that does not change abruptly across the optical cavity of the optoelectronic device. In a preferred embodiment, the resonant reflector has at least one resonant reflector layer that has a refractive index that includes contributions from, for example, both a first material having a first refractive index and a second material having a second refractive index. In a preferred embodiment, the first material is confined to a first region and the second material is confined to a second region, wherein the first region and the second region co-extend along an interface. By making the interface non-parallel with the optical axis of the optoelectronic device, the refractive index of the resonant reflector layer, at least when viewed laterally along the optical cavity of the optoelectronic device, does not change abruptly across the optical cavity. Rather, there is a smooth transition from one refractive index to another. This may reduce the diffraction effects caused by abrupt changes in the refraction index of a resonant reflector.

A number of methods are contemplated for forming a resonant reflector layer that has a smooth transition from one refractive index to another. In one illustrative method, a first substantially planar layer of material is provided and then patterned to form an island over the desired optical cavity. The island is then heated, causing it to reflow. This results in an island of the first layer of material with a non-planar top surface. A second layer of material is then provided over the first layer of material. Because the island of the first layer of material includes a non-planer top surface, and preferably one that tapers down, the second layer of material forms an interface with the first material layer that is non-parallel with the optical axis of the optoelectronic device. As indicated above, this may reduce the diffraction effects caused by abrupt changes in the refraction index of a resonant reflector.

In another illustrative method, a first substantially planar layer of material is provided, followed by a photoresist layer. The photoresist layer is then patterned, preferably forming an island of photoresist. The island of photoresist is then heated, causing it to reflow. This results in a non-planar top surface on the photoresist layer, and preferably one that tapers down toward the first layer of material. Next, the photoresist layer and the first layer of material are etched for a specified period of time. The etchant selectively etches both the photoresist layer and the first layer of material, thereby transferring the shape of the non-planar top surface of the photoresist layer to the first layer of material. A second layer of material is then provided over the first layer of material, if desired. Because the first layer of material assumes the shape of the island of photoresist, and thus has a top surface that tapers down, the second layer of material forms an interface with the first material layer that is non-parallel with the optical axis of the optoelectronic device. As indicated above, this may reduce the diffraction effects caused by abrupt changes in the refraction index of a resonant reflector.

In yet another illustrative method of the present invention, a first substantially planar layer of material is provided and patterned, resulting in an island of the first layer of material. The island of the first material layer preferably has lateral surfaces that extend up to a top surface defined by top peripheral edges. A photoresist layer is then provided over the patterned first layer of material, including over the lateral surfaces, the top peripheral edges and the top surface. The step from the top surface down along the lateral surfaces causes the photoresist layer to be thinner near the top peripheral edges.

The photoresist layer and the first layer of material are then etched for a specified period of time. During this etch process, those regions of the first layer of material that are adjacent the thinner regions of the photoresist layer are subject to the etchant for a longer period of time than those regions that are adjacent thicker regions of the photoresist layer. Thus, in the illustrative embodiment, the top peripheral edges of the first layer of material are etched more than those regions away from the top peripheral edges. After the etch process, a second layer of material may be provided over the first layer of material.

In each of the above embodiments, the top surface of the second layer of material may be planarized by heating the second layer of material to cause it to reflow. Alternatively, or in addition, the top surface of the second layer of material may be planarized using a Chemical Mechanical Polishing (CMP) process. Alternatively, the top surface of the second layer of material may remain substantially non-planar, if desired.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
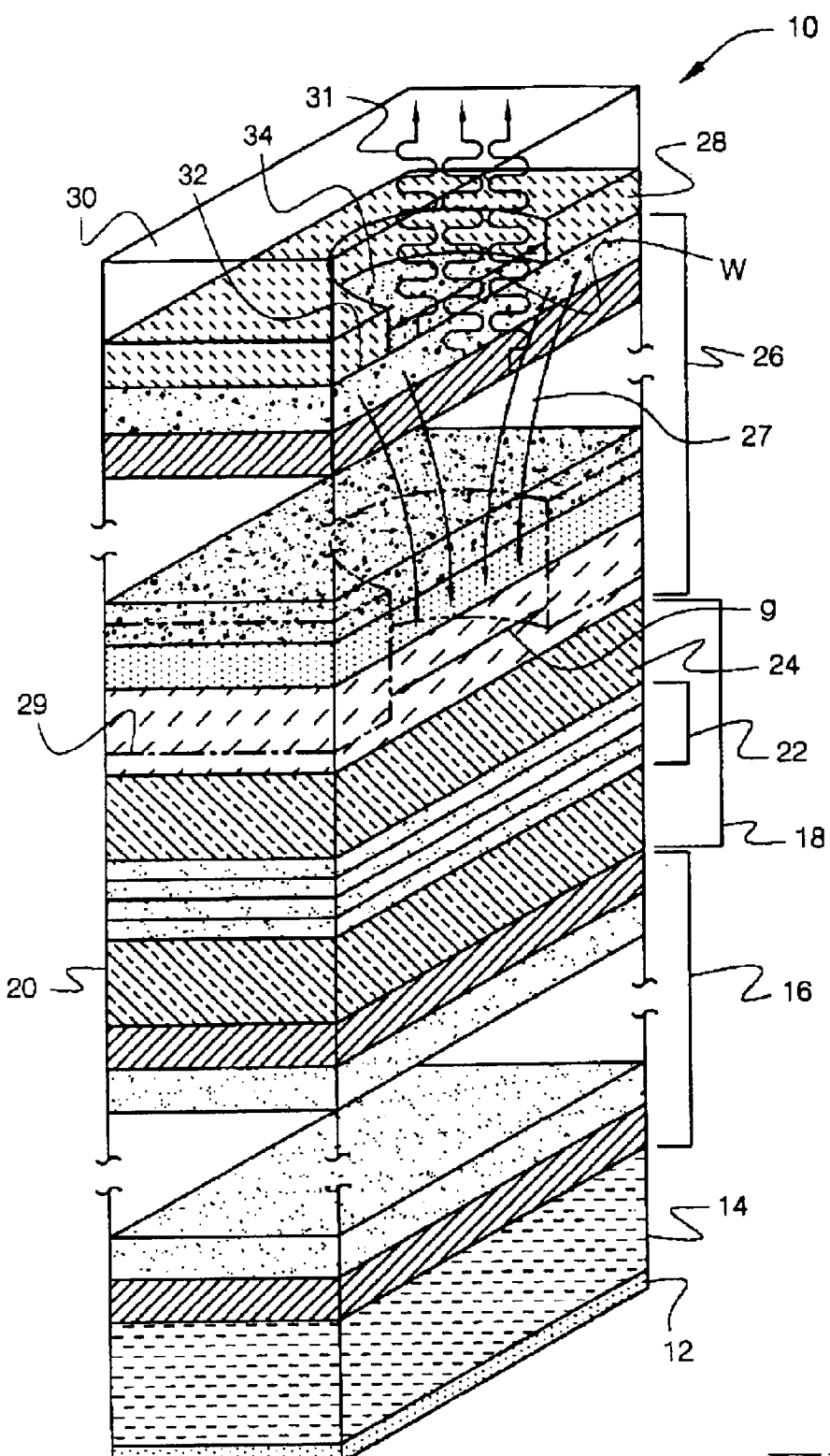
FIG. 1 is a schematic diagram of a planar, current-guided, GaAs/AlGaAs top surface emitting vertical cavity laser in accordance with the prior art.

FIG. 1 is a schematic illustration of a planar, current-guided, GaAs/AlGaAs top surface emitting vertical cavity laser 10 in accordance with the prior art. Formed on an n-doped gallium arsenide (GaAs) substrate 14 is an n-contact 12. Substrate 14 is doped with impurities of a first type (i.e., n type). An n-type mirror stack 16 is formed on substrate 14. Formed on stack 16 is a spacer 18. Spacer 18 has a bottom confinement layer 20 and a top confinement layer 24 surrounding active region 22. A p-type mirror stack 26 is formed on top confinement layer 24. A p-metal layer 28 is formed on stack 26. The emission region may have a passivation layer 30.

Isolation region 29 restricts the area of the current flow 27 through the active region. Region 29 may be formed by deep H+ ion implantation. The diameter "g" may be set to provide the desired active area, and thus the gain aperture of the VCSEL 10. Further, the diameter "g" may be set by the desired resistance of the p-type mirror stack 26, particularly through the non-conductive region 29. Thus, non-conductive region 29 performs the gain guiding function. The diameter "g" is typically limited by fabrication limitations, such as lateral straggle during the implantation step.

Spacer 18 may contain a bulk or quantum-well active region disposed between mirror stacks 16 and 26. Quantum-well active region 22 may have alternating layers of aluminum gallium arsenide (AlGaAs) barrier layers and GaAs quantum-well layers. InGaAs quantum wells may also be used in the active region, particularly where an emission wavelength (e.g. $\lambda$=980 nm) is desired where GaAs is transparent. Stacks 16 and 26 are distributed Bragg reflector (DBR) stacks, and may include periodic layers of doped AlGaAs and aluminum arsenide (AlAs). The AlGaAs of stack 16 is doped with the same type of impurity as substrate 14 (e.g., n type), and the AlGaAs of stack 26 is doped with the other kind of impurity (e.g., p type).

Metal contact layers 12 and 28 are ohmic contacts that allow appropriate electrical biasing of laser diode 10. When laser diode 10 is forward biased with a more positive voltage on contact 28 than on contact 12, active region 22 emits light 31 which passes through stack 26.

Most VCSELs of practical dimensions are inherently multi (transverse) mode. Single lowest-order mode VCSELs are favored for coupling into single-mode fibers, and are advantageous for free-space and/or wavelength sensitive systems, and may even be beneficial for use in extending the bandwidth-length product of standard 50 $\mu$m and 62.5 $\mu$m GRIN multi-mode fiber. However, it has long been known that, although the short optical cavity (2$\lambda$) of the VCSEL favors single longitudinal mode emission, the multi-wavelength (10$\lambda$) lateral dimensions facilitate multi-transverse mode operation.

As indicated above, higher order modes typically have a greater lateral concentration of energy away from the center of the optical or lasing cavity. Thus, the most obvious way to force the laser to oscillate in only a lowest order circularly symmetric mode is to make the lateral dimension "g" of the active area small enough to prevent higher-order modes from reaching threshold. However, this necessitates lateral dimensions of less than about 5 $\mu$m for typical VCSELs. Such small areas may result in excessive resistance, and push the limits obtainable from conventional fabrication methodologies. This is particularly true for implantation depths of greater than about 1 $\mu$m, where lateral straggle may become a limiting factor. Thus, control of transverse modes remains difficult for VCSEL's of practical dimensions.

Figure 2:
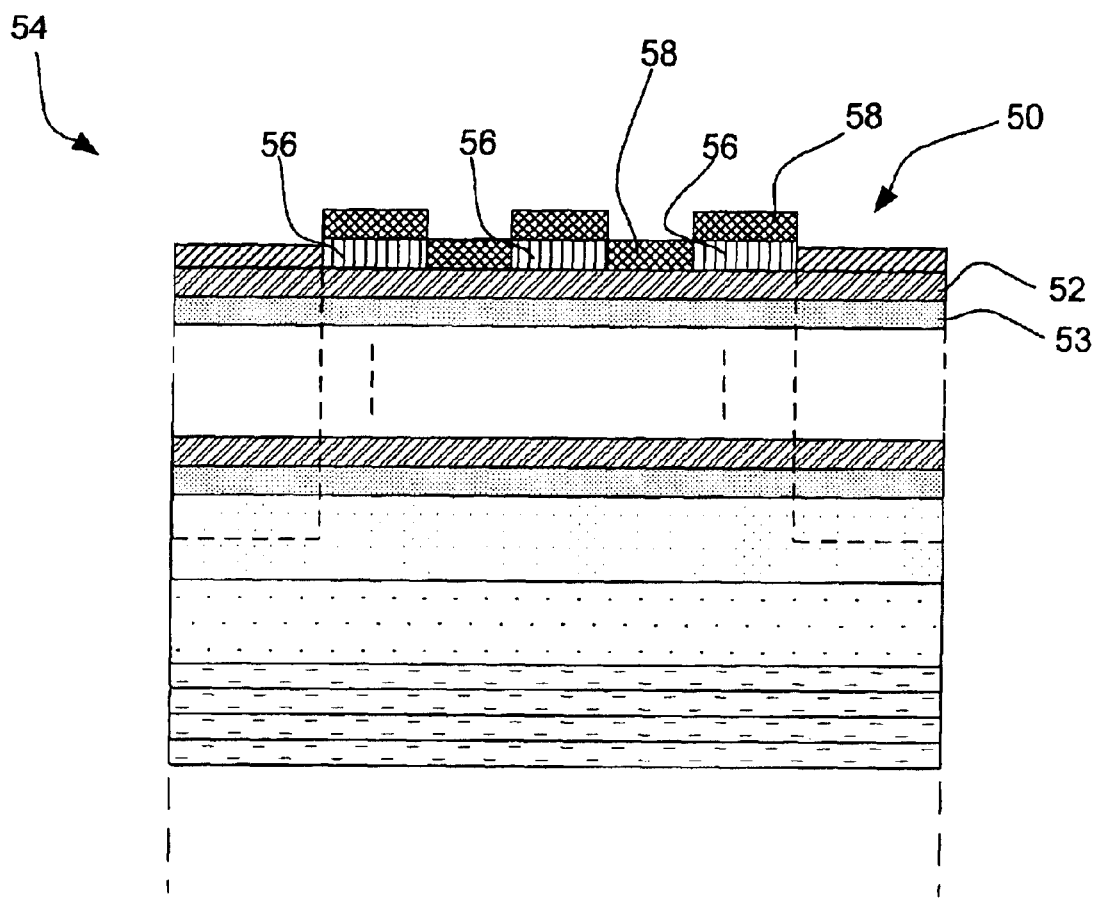
FIG. 2 is a schematic cross-sectional side view of a planar, current-guided, GaAs/AlGaAs top surface emitting vertical cavity laser with a first illustrative resonant reflector for increased mode control in accordance with the present invention.

One illustrative approach for controlling transverse modes of an optoelectronic device is shown in FIG. 2. FIG. 2 is a schematic cross-sectional side view of a planar, current-guided, GaAs/AlGaAs top surface emitting vertical cavity laser, as in FIG. 1, with a top mounted mode control resonant reflector 50. The resonant reflector 50 includes a patterned first material layer 56 that is positioned on top of the top mirror layer 52 of VCSEL 54. A second material layer 58 is provided over the patterned first material layer 56, as shown.

The first material layer 56 preferably has a refractive index that is less than me refractive index of the second material layer 58, and the first and second material layers 56 and 58 preferably have a refractive index that is less than the refractive index of the top mirror layer 52 of the optoelectronic device 54. In one example, the first material layer 56 is $SiO_2$, the second material layer 58 is $Si_3N_4$ or $TiO_2$, and the top mirror layer 52 is AlGaAs, although other suitable material systems are contemplated. Each layer is preferably an odd multiple of one-quarter wavelength ($\lambda/4$) thick. This causes a reduction in reflectivity of the resonant reflector 50 in those regions that correspond to the etched regions 60 (see FIG. 3B) in the first material layer 56, that is, those regions that are filled with the second material layer 58. By designing the etched regions to circumscribe the desired optical cavity, this difference in reflectivity can be used to help provide mode control for VCSEL 54.

Figure 3A:
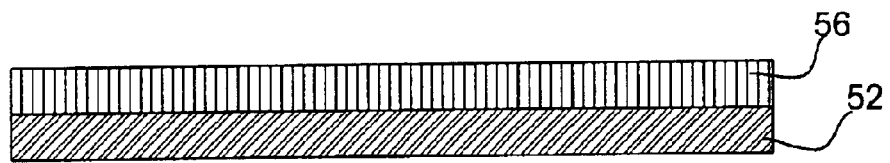
FIGS. 3A–3D are schematic cross-sectional side views showing an illustrative method for making the resonant reflector of FIG. 2.
Figure 3B:
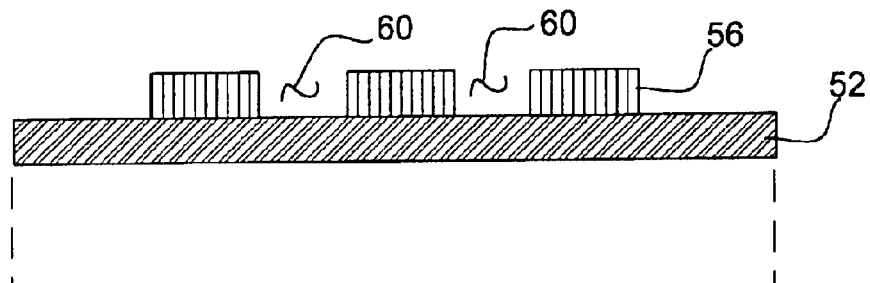
Figure 3C:
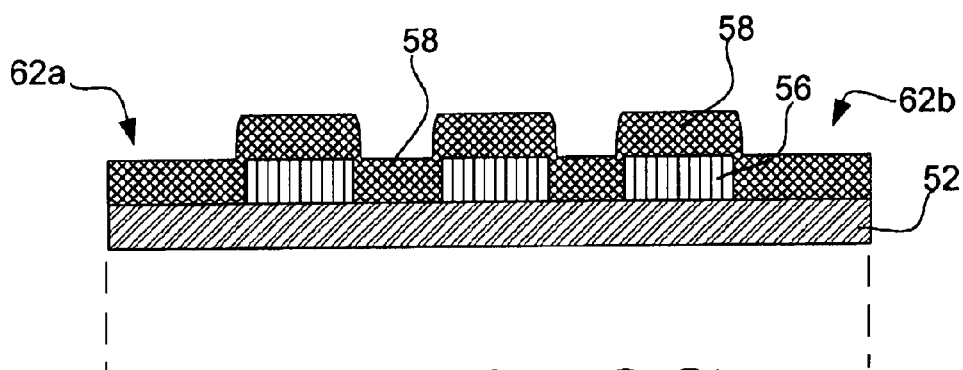
Figure 3D:
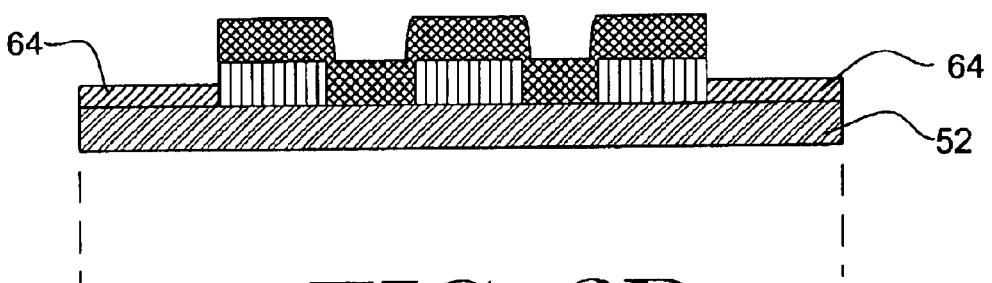

In forming the resonant reflector 50, and referring now to FIG. 3A, the first material layer 56 is provided over the top mirror layer 52. As shown in FIG. 3B, the first material layer 56 is patterned, preferably by etching away the first material layer 56 in the region or regions circumscribing the desired optical cavity of the VCSEL 54. As shown in FIG. 3C, a second material layer 58 is provided over the first material layer 56. The second material layer 58 is preferably provided over both the etched 60 and non-etched regions of the first material layer 56, but may be confined to the non-etched regions if desired. Selected regions, such as regions 62a and 62b of the second material layer 58 may then be removed to provide access to the top mirror layer 52. Then, and as shown in FIG. 3D, a contact layer 64 may be provided on the exposed regions of the top mirror layer 52. The contact layer 64 may provide electrical contact to the top mirror layer 52.

In a related embodiment, a top mirror layer of the optoelectronic device may function as the first material layer 56 discussed above. Thus, the top mirror layer may be patterned, preferably by etching at least partially into the top mirror layer in the region or regions circumscribing the desired optical cavity of the optoelectronic device. In one embodiment, the layer 52 below the top mirror layer may function as an etch stop layer. Then, a second material layer 58 is provided over the top mirror layer. The second material layer is preferably provided over both the etched and non-etched regions of the top mirror layer, but may only be provided over the non-etched regions, if desired. In this embodiment, the regions labeled 56 in FIGS. 2–3 should have the same cross-hatch pattern as layer 53, and the refractive index of these regions should be less than the refractive index of layer 52.

Figure 4:
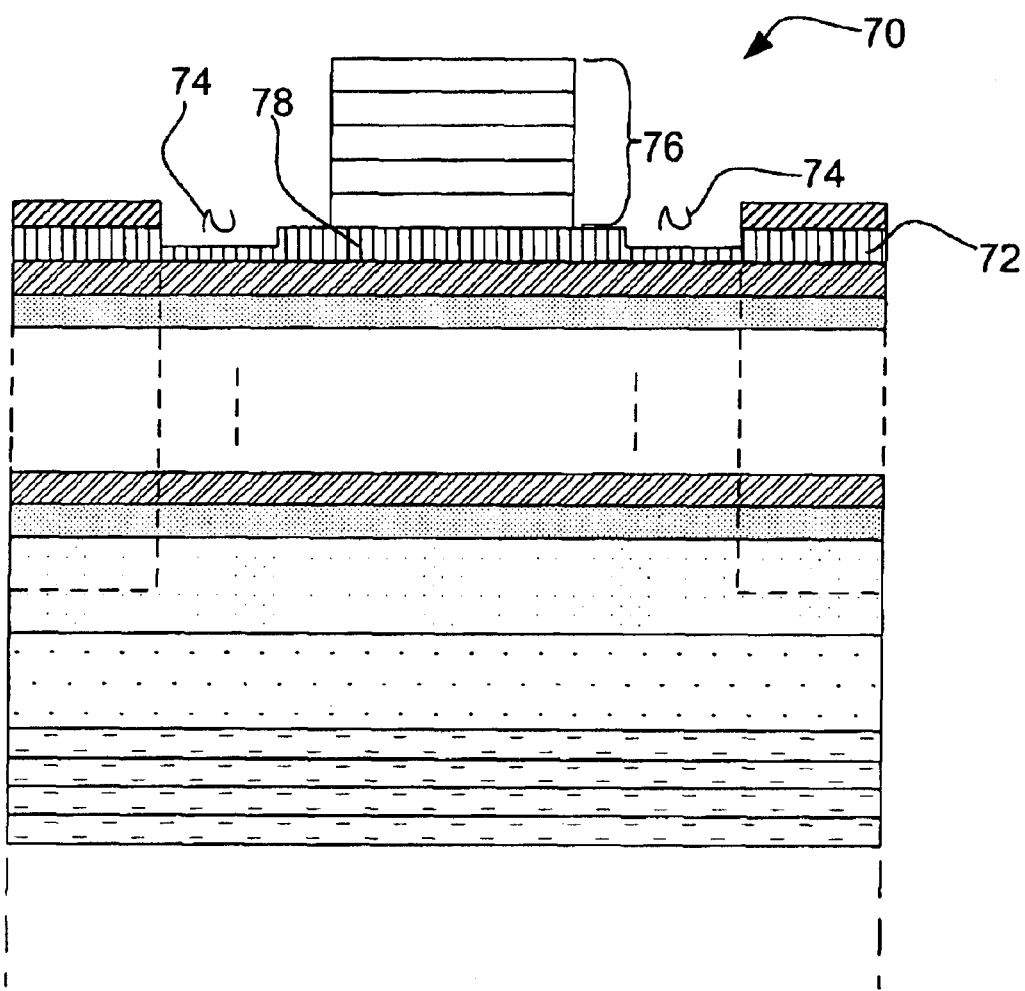
FIG. 4 is a schematic cross-sectional side view of a planar, current-guided, GaAs/AlGaAs top surface emitting vertical cavity laser with a second illustrative resonant reflector for increased mode control in accordance with the present invention.

Another illustrative approach for controlling transverse modes of an optoelectronic device is shown in FIG. 4. FIG. 4 is a schematic cross-sectional side view of a planar, current-guided, GaAs/AlGaAs top surface emitting vertical cavity laser, as in FIG. 1, with another illustrative top mounted mode control resonant reflector 70. In this embodiment, the resonant reflector 70 is formed by etching down into but not all the way through one or more of the top mirror layers 72 of the optoelectronic device. The etched region, generally shown at 74, preferably circumscribes the desired optical cavity of the optoelectronic device, and has a depth that causes a phase shift that reduces the reflectivity of the resonant reflector 70 at the desired operating wavelength, such as a depth that corresponds to an odd multiple of $\lambda/4$. To provide further differentiation, a cap mirror 76 having one or more additional layers may be provided on selected non-patterned regions 78 of the top mirror layer 72, such as over the desired optical cavity of the optoelectronic device. The cap mirror 76 may include one or more periods of a conventional semiconductor DBR mirror, or more preferably, a narrow band dielectric reflection filter. A metal layer may be provided on selected regions of the top mirror layer 72. The metal layer may function as a top contact layer.

Figure 5A:
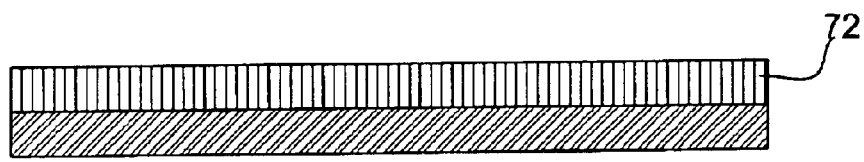
FIGS. 5A–5D are schematic cross-sectional side views showing an illustrative method for making the resonant reflector of FIG. 4.
Figure 5B:
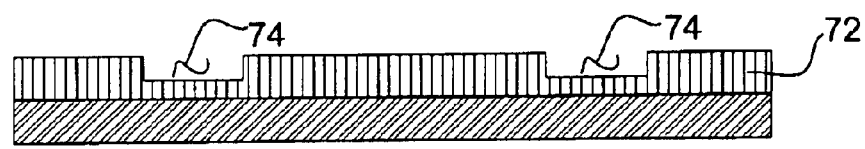

In forming the resonant reflector 70, and referring now to FIGS. 5A–5B, a top mirror layer 72 (or some other top layer) is patterned and etched to form one or more etched regions 74. The etched regions 74 are preferably formed to circumscribe the desired optical cavity of the optoelectronic device. Also, the etched regions 74 are preferably etched down to a depth that causes a phase shift in the incident light, thereby reducing the reflectivity of the resonant reflector 70 in those regions.

Figure 5C:
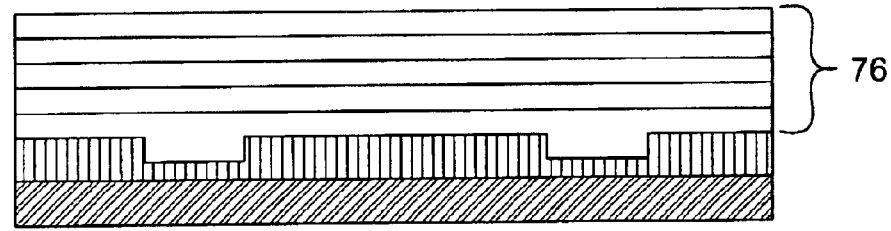
Figure 5D:
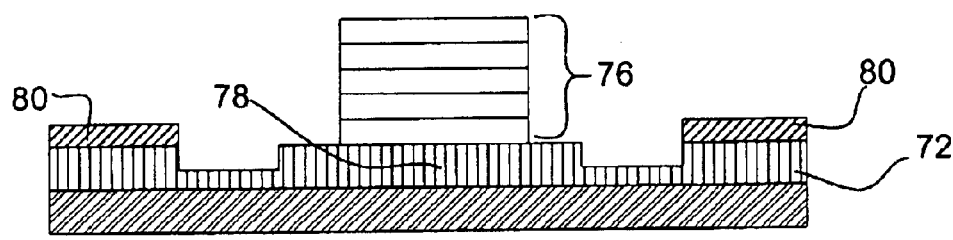

Next, and as shown in FIG. 5C, a cap mirror 76 is formed on the patterned top mirror layer 72. As indicated above, the top mirror layer 72 may include one or more semiconductor DBR mirror periods, and/or a narrow band dielectric reflection filter. In either case, and to provide further differentiation in reflectivity, the cap mirror 76 may be etched away except on those areas that correspond to the desired optical cavity of the optoelectronic device. This is shown in FIG. 5D. Alternatively, the patterned cap mirror 76 may be formed using well known lift-off techniques. Thereafter, a contact layer 80 may be provided on the selected regions of the top mirror layer 72. The contact layer 80 may provide electrical contact to the top mirror layer 72.

Figure 6:
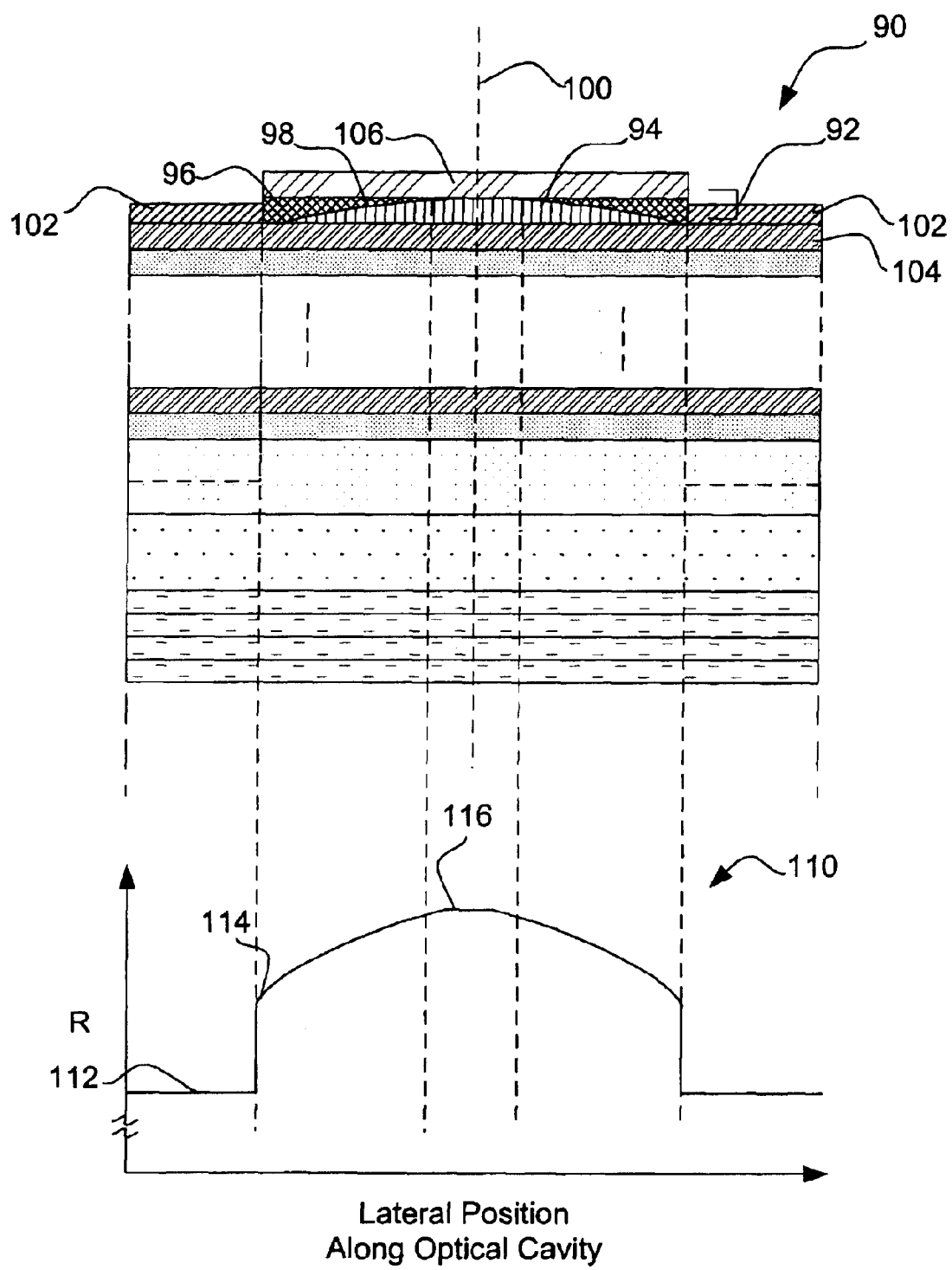
FIG. 6 is a schematic cross-sectional side view of a planar, current-guided, GaAs/AlGaAs top surface emitting vertical cavity laser with yet another illustrative resonant reflector for increased mode control in accordance with the present invention.

Another illustrative approach for controlling transverse modes of an optoelectronic device is shown in FIG. 6. FIG. 6 is a schematic cross-sectional side view of a planar, current-guided, GaAs/AlGaAs top surface emitting vertical cavity laser, as in FIG. 1, with yet another illustrative top mounted mode control resonant reflector 90. In this illustrative embodiment, the resonant reflector 90 has a refractive index that does not abruptly change across the optical cavity of the optoelectronic device.

In a preferred embodiment, the resonant reflector 90 has at least one resonant reflector layer 92 that has a refractive index. The refractive index may include, for example, contributions from both a first material 94 having a first refractive index and a second material 96 having a second refractive index. In a preferred embodiment, the first material 94 is confined to a first region and the second material is confined to a second region, wherein the first region and the second region co-extend along an interface 98. By making the interface 98 non-parallel with the optical axis 100 of the optoelectronic device, the refractive index of the resonant reflector layer, at least when viewed laterally along the optical cavity of the optoelectronic device, does not change abruptly across the optical cavity. Rather, there is a smooth transition from one refractive index to another. This reduces the diffraction effects caused by abrupt changes in the refraction index. It is contemplated that one or more periods of a conventional semiconductor DBR mirror, or more preferably, a narrow band dielectric reflection filter 106, may be provided on top of the resonant reflector 90, as shown. Finally, a contact layer 102 may be provided around the periphery of the optical cavity. In the embodiment shown, the contact layer 102 is in direct contact with the top mirror layer 104 and provides electrical contact to the top mirror layer 104.

The smooth transition from one refractive index to another is further illustrated in chart 110. The X axis of chart 110 represents the lateral position along the optical cavity of the device shown above the chart. The Y axis of chart 110 corresponds to the reflectivity "R" of the top mirror, including the resonant reflector 90 and conventional semiconductor DBR mirror or dielectric reflection filter 106. The reflectivity "R" of the top mirror, at least in the region of the resonant reflector 90, is dependent on the refractive index of the resonant reflector layer 90.

Traveling from left to right laterally along the optical cavity of the optoelectronic device, the reflectivity starts at a first value 112. The first value 112 is shown relatively low because the resonant reflector 90 and the conventional semiconductor DBR mirror or dielectric reflection filter 106 do not extend out into this region. The contact layer 102 may also decrease the reflectivity in this region.

At the edge of the resonant reflector 90, the reflectivity increases to a value 114, which includes contributions from the second material 96 of the resonant reflector layer 90 and the conventional semiconductor DBR mirror or dielectric reflection filter 106. Moving further to the right, the refractive index of the resonant reflector 90 begins to change due to the relative contributions of the first material 94 and the second material 96. This causes the reflectivity of the resonant reflector 90 to smoothly increase toward the center of the desired optical cavity, as shown. Preferably, the reflectivity of the resonant reflector 90 reaches a maximum 116 in or around the center of the desired optical cavity. The reflectivity of the resonant reflector 90 then decreases to the right of the center of the desired optical cavity, in an opposite manner to that described above. As can be seen, the refractive index, and thus the reflectivity, of the resonant reflector 90 does not change abruptly across the optical cavity. Rather, there is a smooth transition from one refractive index to another. This reduces the diffraction effects often caused by abrupt changes in the refraction index of a resonant reflector.

FIGS. 7A–7D are schematic cross-sectional side views showing a first illustrative method for making the resonant reflector of FIG. 6. In this illustrative embodiment, a first substantially planar layer of material 94 is provided on, for example, a top mirror layer 104 of a conventional DBR mirror. The top mirror layer 104 preferably has a refractive index that is higher than the refractive index of the first layer of material 94. The top mirror layer 104 may be, for example, AlGaAs, and the first layer of material 94 may be, for example, SiO2, or a polymer such as polyamide or Benzocyclobuthene (BCB).

Figure 7A:
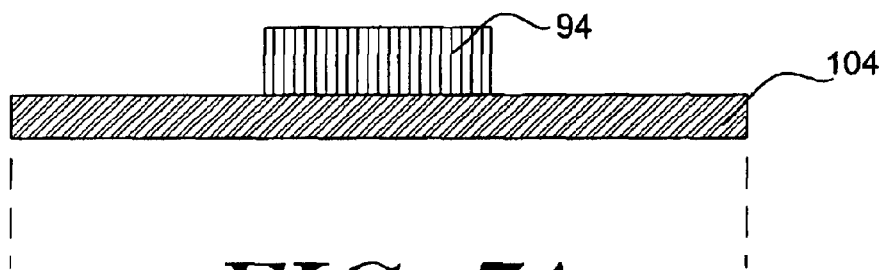
FIGS. 7A–7D are schematic cross-sectional side views showing a first illustrative method for making the resonant reflector of FIG. 6.
Figure 7B:
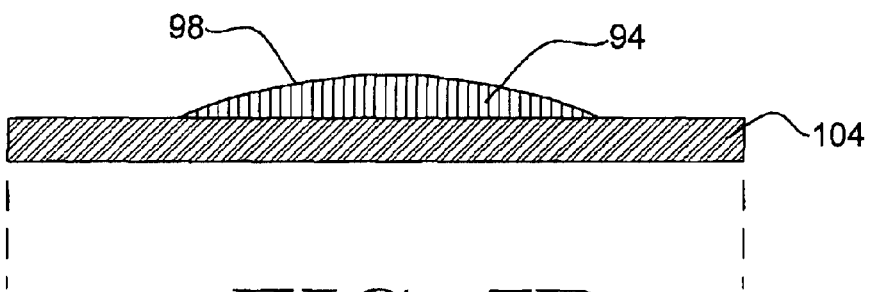
Figure 7C:
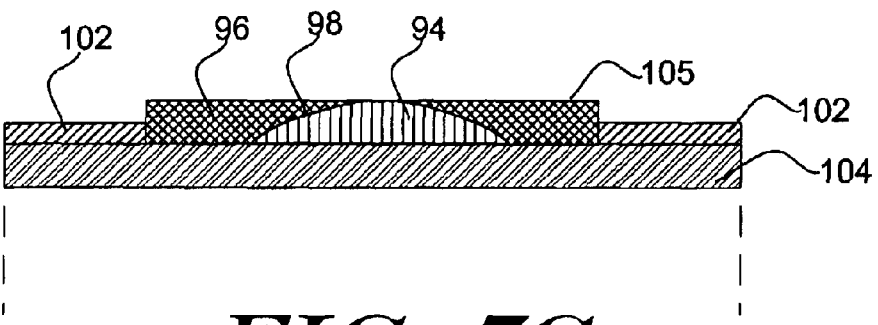

The first layer of material is then patterned, as shown in FIG. 7A. This is typically done using a conventional etch process. As shown in FIG. 7B, the patterned first layer of material 104 is then heated, which causes it to reflow. This results in a non-planar top surface 98. Then, and as shown in FIG. 7C, a second layer of material 96 is provided over the first layer of material 94. The top surface 105 of the second layer of material 96 is preferably substantially planar, but it may be non-planar if desired. The second layer of material 96 preferably has a refractive index that is higher than the refractive index of the first layer of material 94. The second layer of material 96 may be, for example, TiO2, Si3N4, a polymer, or any other suitable material. When desired, the top surface 105 of the second layer of material 96 may be planarized using any suitable method including, for example, reflowing the second layer of material 96, mechanical, chemical or chemical-mechanical polishing (CMP) the second layer of material 96 etc. In some embodiments, the to surface 105 is left non-planar.

Figure 7D:
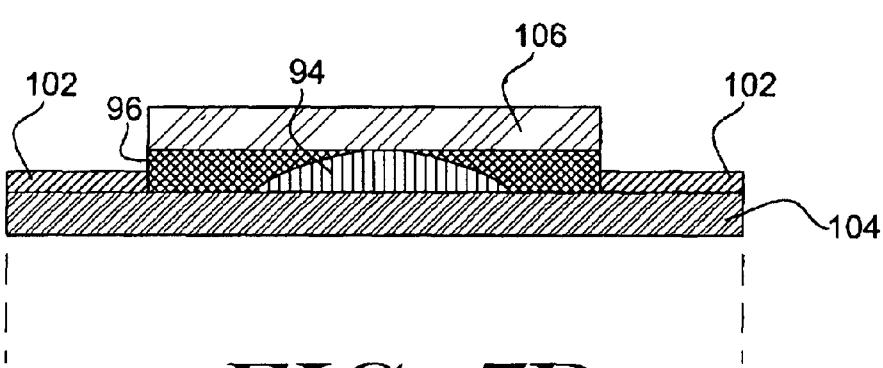

The second layer of material 96 is preferably provided over the entire top surface of the resonant reflector, and etched away in those regions where a top contact 102 is desired. Once the second layer of material 96 is etched, a contact layer 102 is provided on the exposed regions of the top mirror layer 104. The contact layer 102 provides electrical contact to the top mirror layer 104. As shown in FIG. 7D, a cap mirror 106 may then be provided above the second layer of material 96. The cap mirror 106 may include one or more periods of a conventional semiconductor DBR mirror, or more preferably, a narrow band dielectric reflection filter.

Figure 8A:
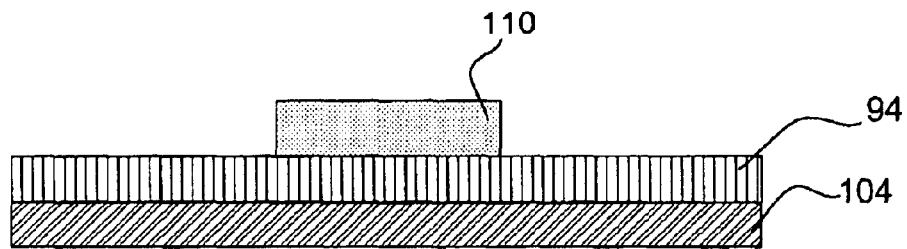
FIGS. 8A–8E are schematic cross-sectional side views showing another illustrative method for making the resonant reflector of FIG. 6.

FIGS. 8A–8E are schematic cross-sectional side views showing another illustrative method for making the resonant reflector of FIG. 6. In this illustrative embodiment, and as shown in FIG. 8A, a first substantially planar layer of material 94 is provided on, for example, a top mirror layer 104 of a conventional DBR mirror. The top mirror layer 104 preferably has a refractive index that is higher than the refractive index of the first layer of material 94. The top mirror layer 104 may be, for example, AlGaAs, and the first layer of material 94 may be, for example, SiO2, or any other suitable material. Next, a photoresist layer 110 is provided and patterned on the first layer of material 94, preferably forming an island of photoresist above the desired optical cavity of the optoelectronic device.

Figure 8B:
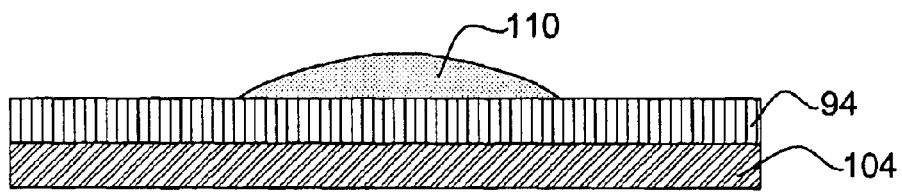
Figure 8C:
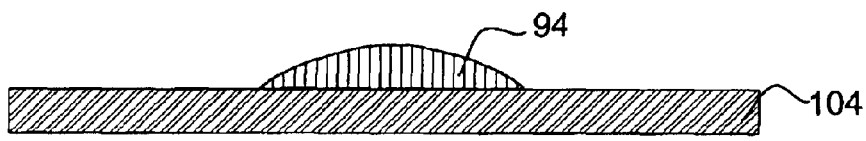

As shown in FIG. 8B, the photoresist layer 110 is then heated, causing it to reflow. This results in a non-planar top surface on the photoresist layer 110. That is, the top surface of the photoresist layer 110 may have portions that taper down toward the first layer of material 94. Next, and as shown in FIG. 8C, the photoresist layer 110 and the first layer of material 94 are etched for a specified period of time. The etchant preferably selectively etches both the photoresist layer 110 and the first layer of material 94. This transfers the shape of the non-planar top surface of the photoresist layer 110 to the first layer of material 94.

Figure 8D:
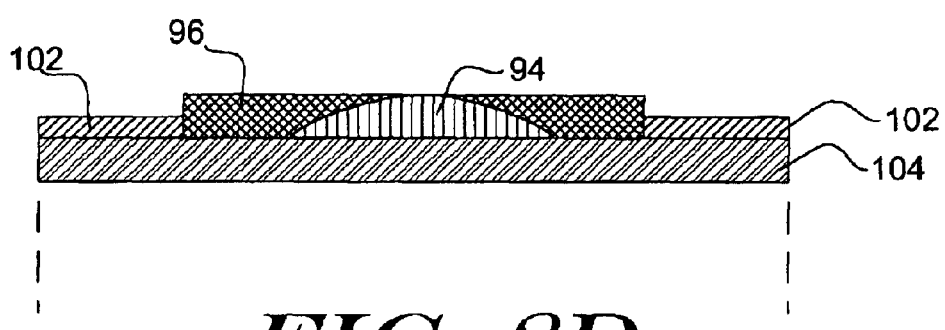
Figure 8E:
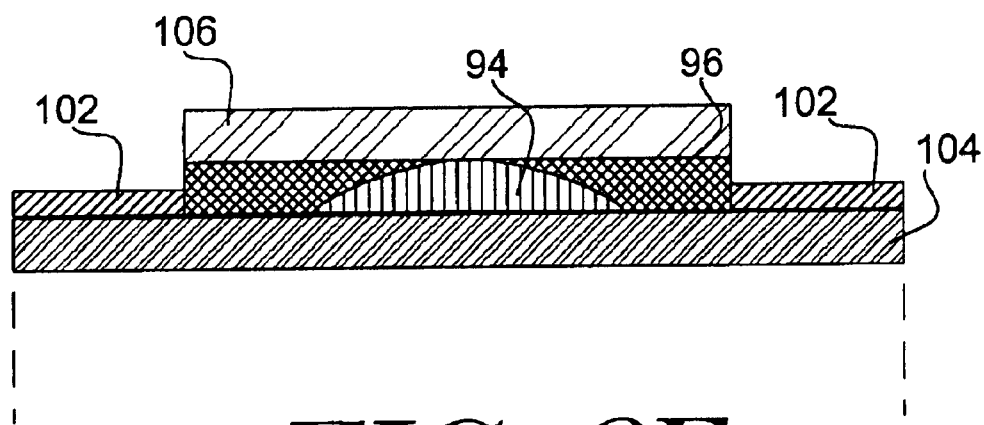

As shown in FIG. 8D, a second layer of material 96 is then provided over the first layer of material 94. The second layer of material 96 preferably has a refractive index that is higher than the refractive index of the first layer of material 94. The second layer of material 96 is preferably provided over the entire top surface of the resonant reflector, and etched away in those regions where a top contact 102 is desired. Once the second layer of material 96 is etched, a contact layer 102 is provided on the exposed regions of the top mirror layer 104. The contact layer 102 provides electrical contact to the top mirror layer 104. Preferably, the top surface of the second layer of material 96 is substantially planar. As shown in FIG. 8E, a cap mirror 106 may be provided above the second layer of material 96, if desired. The cap mirror 106 may include one or more periods of a conventional semiconductor DBR mirror, or more preferably, a narrow band dielectric reflection filter.

Figure 9A:
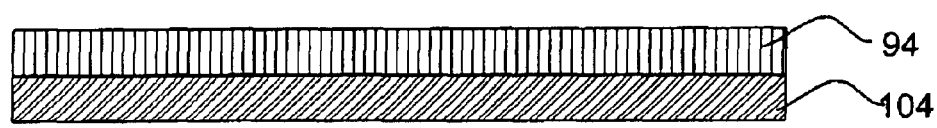
FIGS. 9A–9E are schematic cross-sectional side views showing yet another illustrative method for making the resonant reflector of FIG. 6.

FIGS. 9A–9E are schematic cross-sectional side views showing yet another illustrative method for making the resonant reflector of FIG. 6. In this illustrative embodiment, and as shown in FIG. 9A, a first substantially planar layer of material 94 is provided on, for example, a top mirror layer 104 of a conventional DBR mirror. Like above, the top mirror layer 104 preferably has a refractive index that is higher than the refractive index of the first layer of material 94.

Figure 9B:
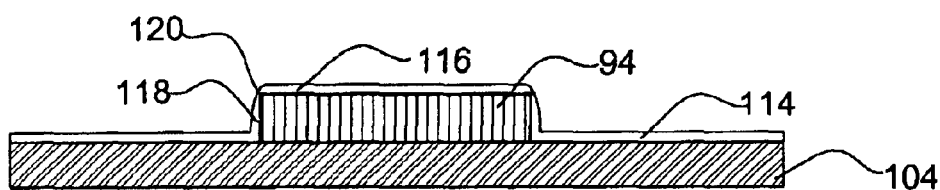

Next, and as shown in FIG. 9B, the first layer of material 94 is patterned, preferably forming an island above the desired optical cavity of the optoelectronic device. This results in the first layer of material 94 having lateral surfaces 118 that extend up to a top surface 116 that is defined by top peripheral edges 120. A photoresist layer 114 is then provided over the patterned first layer of material 94, including over the lateral surfaces 118, the top peripheral edges 120 and the top surface 116. Because of the step between the top surface 116 and the lateral surfaces 118, the photoresist layer 114 is thinner near the top peripheral edges 120 than along either the lateral surfaces 118 or top surface 116 of the patterned first layer of material 94, as shown.

Figure 9C:
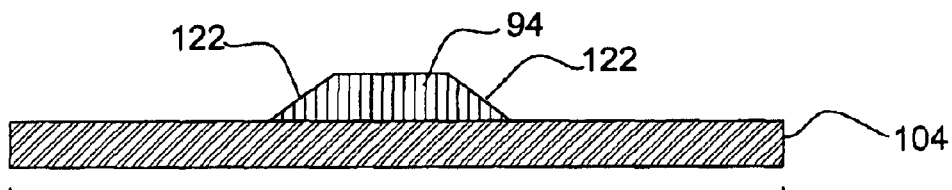

As shown in FIG. 9C, the photoresist layer 114 and the first layer of material 94 are then etched for a specified period of time. During this etch step, those regions of the first layer of material 94 that are adjacent the thinner regions of the photoresist layer 114 are subject to the etchant for a longer period of time than those regions that are adjacent thicker regions of the photoresist layer 114. Thus, and as shown in FIG. 9C, the top peripheral edges 120 of the first layer of material 94 are etched more than those regions away from the top peripheral edges 120, resulting in tapered edges 122.

Figure 9D:
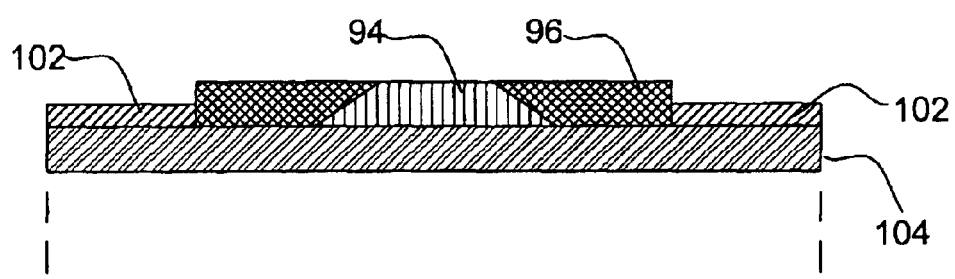

After the etching step, and as shown in FIG. 9D, a second layer of material 96 may be provided over the first layer of material 94. Like above, the second layer of material 96 preferably has a refractive index that is higher than the refractive index of the first layer of material 94. The second layer of material 96 is preferably provided over the entire top surface of the resonant reflector, and etched away in those regions where a top contact 102 is desired. Once the second layer of material 96 is etched, a contact layer 102 is provided on the exposed regions of the top mirror layer 104. The contact layer 102 provides electrical contact to the top mirror layer 104. Preferably, the top surface of the second layer of material 96 is substantially planar.

Figure 9E:
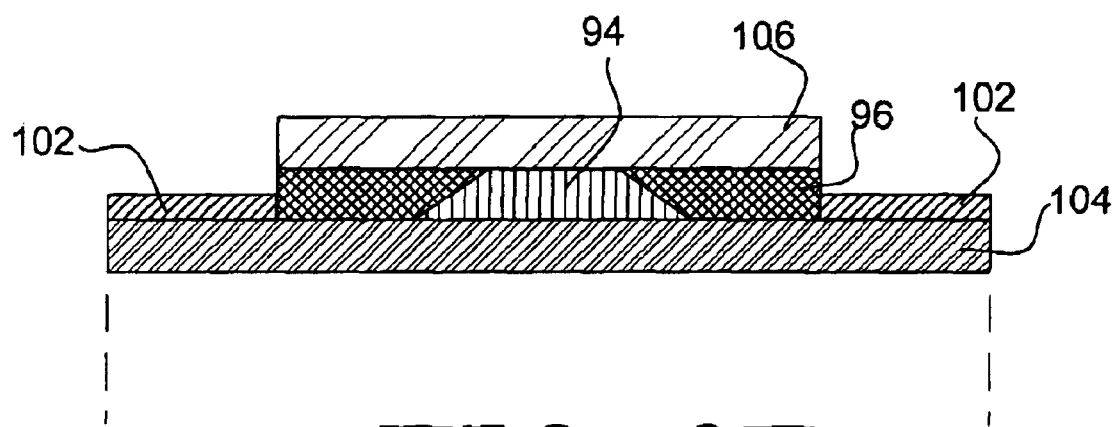

As shown in FIG. 9E, a cap mirror 106 may be provided above the second layer of material 96, if desired. The cap mirror 106 may include one or more periods of a conventional semiconductor DBR mirror, or more preferably, a narrow band dielectric reflection filter.

Figure 10:
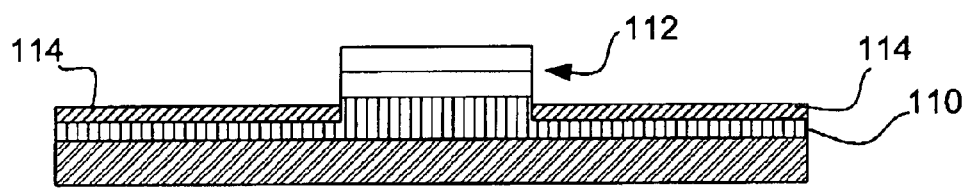
FIG. 10 is a schematic cross-sectional side view showing another illustrative embodiment of the present invention similar to that shown in FIGS. 5A–5D.

FIG. 10 is a schematic cross-sectional side view showing another illustrative embodiment of the present invention similar to that shown in FIGS. 5A–5D. In this embodiment, a top layer 110, which may be the top mirror layer of the top DBR mirror stack of the optoelectronic device or an additional layer on top of the top mirror layer, may be etched down—but not all the way through. The etched region preferably circumscribes the desired optical cavity of the optoelectronic device, and has a depth that causes a phase shift that reduces the reflectivity of the resonant reflector at the desired operating wavelength, such as a depth that corresponds to an odd multiple of $\lambda/4$. Like in FIGS. 5A–5D, a cap mirror 112 having one or more additional layers may be provided on selected non-patterned regions of layer 110, such as over the desired optical cavity of the optoelectronic device, to provide further differentiation in reflectivity. A metal layer 114 may then be provided on the etched region of layer 110. The metal layer may function as the top contact. By extending the metal layer 114 all the way or near the cap mirror 112, better current spreading can be achieved for the optoelectronic device.

Figure 11:
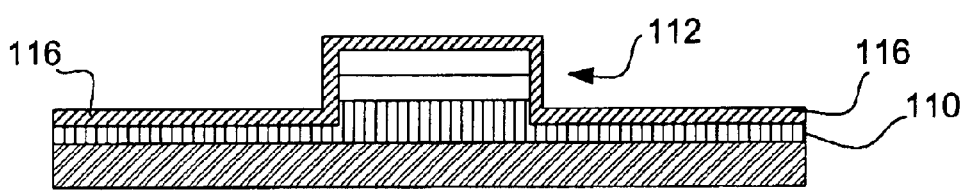
FIG. 11 is a schematic cross-sectional side view showing another illustrative embodiment of the present invention similar to that shown in FIGS. 5A–5D.

FIG. 11 is a schematic cross-sectional side view showing another illustrative embodiment of the present invention similar to that shown in FIGS. 5A–5D. This embodiment is similar to that of FIG. 10, but the metal layer, now labeled 116, extends over the etched region of layer 110 and over the cap mirror 112. For back illumination devices, this may provide even better current spreading for the optoelectronic device.

Figure 12:
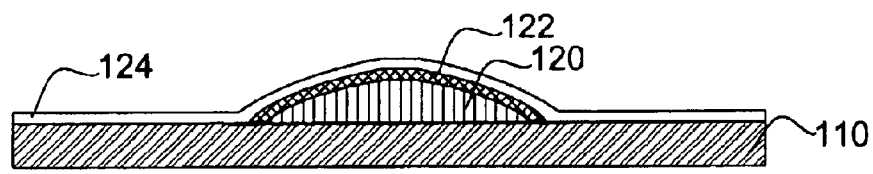
FIG. 12 is a schematic cross-sectional side view showing another illustrative embodiment of the present invention similar to that shown in FIGS. 8A–8E.

FIG. 12 is a schematic cross-sectional side view showing another illustrative embodiment of the present invention similar to that shown in FIGS. 8A–8E. A resonant reflector is provided that has a refractive index that does not change abruptly across the optical cavity of the optoelectronic device. The illustrative resonant reflector includes at least one resonant reflector layer that has a refractive index that includes contributions from, for example, both a first material 120 having a first refractive index and a second material 122 having a second refractive index. In the embodiment shown, the first material 120 is confined to a first region and the second material 122 is confined to a second region, wherein the first region and the second region co-extend along an interface. A metal layer 124 is then provided over the entire structure. For back illumination devices, the metal layer 124 may provide enhanced current spreading when compared to the device shown in FIGS. 8A–8E.

Having thus described the preferred embodiments of the present invention, those of skill in the art will readily appreciate that the teachings found herein may be applied to yet other embodiments within the scope of the claims hereto attached.

What is claimed is:

1. A resonant reflector for an optoelectronic device tuned to a wavelength, the resonant reflector comprising:
    a first material layer having a thickness of an odd multiple of a quarter of the wavelength and also having a first refractive index, the first material layer having one or more patterned regions that extend down into the first material layer thus reducing the thickness of the first material layer in the one or more patterned regions, selected patterned regions being at least partially filled with a second material having a second refractive index, the first refractive index being less than the second refractive index, the second material having a thickness of an odd multiple of a quarter the wavelength; and
    a third layer positioned immediately adjacent the first material layer, the third layer having a third refractive index that is greater than the first refractive index.

2. A resonant reflector for an optoelectronic device tuned to a wavelength, the resonant reflector comprising:
    a first material layer having a thickness of an odd multiple of a quarter of the wavelength and also having a first refractive index, the first material layer having one or more patterned regions that extend all the way through the first material layer, selected patterned regions being at least partially filled with a second material having a second refractive index, the first refractive index being less than the second refractive index; and
    a third layer positioned immediately adjacent the first material layer, the third layer having a third refractive index that is greater than the first refractive index.

3. A resonant reflector according to claim 2, wherein the second material also extends above the non-patterned regions of the first material layer.

4. A resonant reflector according to claim 2, wherein the one or more patterned regions reduce the reflectivity of the resonant reflector in those regions.

5. A resonant reflector according to claim 4, wherein the one or more patterned regions are positioned to provide mode control to the optoelectronic device.

6. A resonant reflector according to claim 2, wherein the first material is SiO2, the second material is Si3N4 or TiO2, and the third layer is AlGaAs.

7. A resonant reflector according to claim 2 wherein the first material layer is a top mirror layer of a DBR mirror.

8. A resonant reflector for an optoelectronic device, the resonant reflector comprising:

a first mirror region having a top mirror layer, the top mirror layer having one or more patterned regions that extend down into the top mirror layer but not all the way through, and one or more non-patterned regions; and a second mirror region formed on selected non-patterned regions of the top mirror layer.

9. A resonant reflector according to claim 8, wherein the one or more patterned regions reduce the reflectivity of the resonant reflector in those regions.

10. A resonant reflector according to claim 9, wherein the one or more patterned regions provide a phase shift relative to the non-patterned regions.

11. A resonant reflector according to claim 9, wherein the one or more patterned regions are positioned to provide mode control to the optoelectronic device.

12. A resonant reflector for an optoelectronic device, the resonant reflector comprising:

a top mirror with a top mirror layer, the top mirror layer etched with a pattern down but not through the top mirror layer resulting in one or more patterned regions and one or more non-patterned regions, wherein the one or more patterned regions reduce the reflectivity of the resonant reflector in those regions;

a cap mirror situated above selected non-patterned regions of the top mirror layer.

13. A resonant reflector according to claim 12, wherein the one or more patterned regions provide a phase shift relative to the non-patterned regions.

14. A resonant reflector according to claim 12, wherein the one or more patterned regions are positioned to provide mode control to the optoelectronic device.

15. A resonant reflector for an optoelectronic device that has an optical cavity with an optical axis, the resonant reflector comprising:

a resonant reflector layer extending across at least part of the optical cavity of the optoelectronic device, the resonant reflector layer having a refractive index that does not abruptly change laterally across the optical cavity;

the refractive index of the resonant reflector layer including contributions from a first material having a first refractive index and a second material having a second refractive index, at least one of the first material and the second material being a polymer.

16. A resonant reflector according to claim 15, wherein the first material is confined to a first region and the second material is confined to a second region, the first region and the second region co-extending along an interface, wherein at least part of the interface is not parallel to the optical axis of the optoelectronic device.

17. A resonant reflector according to claim 15, wherein the first refractive index is less than the second refractive index.

18. A resonant reflector according to claim 15, wherein the first material is AlGaAs and the second material is a polymer.

19. A resonant reflector according to claim 18, wherein the polymer is polyimide or Benzocyclobuthene (BCB).

20. A resonant reflector according to claim 15, further comprising a mirror having a top mirror layer, the top mirror layer positioned adjacent to the resonant reflector layer.

21. A resonant reflector according to claim 20, wherein the top mirror layer has a refractive index that is greater than the first refractive index and the second refractive index.

22. A resonant reflector according to claim 21, wherein the top mirror layer is AlGaAs.

23. A resonant reflector for an optoelectronic device that has an optical cavity with an optical axis, the resonant reflector comprising:

a resonant reflector layer defined by two substantially planar opposing surfaces extending across at least part of the optical cavity of the optoelectronic device, the resonant reflector layer having a first region with a first refractive index and a second region with a second refractive index, the first region and the second region co-extending along an interface, at least part of the interface being not parallel to the optical axis.

24. A resonant reflector according to claim 23, wherein the first region is positioned toward the center of the optical cavity and has lateral edges that are not parallel to the optical axis, and the second region has lateral edges that co-extend along the lateral edges of the first region.

25. A resonant reflector for an optoelectronic device tuned to a wavelength, the resonant reflector comprising:

a first material layer having a thickness of an odd multiple of a quarter of the wavelength and also having a first refractive index, the first material layer having one or more patterned regions that extend down into the first material layer thus reducing the thickness of the first material layer in the one or more patterned regions, selected patterned regions being at least partially filled with a second material having a second refractive index, the first refractive index being less than the second refractive index; and a third layer positioned immediately adjacent the first material layer, the third layer having a third refractive index that is greater than the first refractive index.

* * * * *

UNITED STATES PATENT AND TRADEMARK OFFICE
CERTIFICATE OF CORRECTION

PATENT NO. : 6,727,520 B2
DATED : April 27, 2004
INVENTOR(S) : Morgan et al.

It is certified that error appears in the above-identified patent and that said Letters Patent is hereby corrected as shown below:

Title page,
Item [56], References Cited, OTHER PUBLICATIONS,
"Morgan" 1st reference, before "96-nm" change "$C_9$" to -- C, --.
"Morgan" 2nd reference, after "*Appl.*" change "*Phy*" to -- *Phys.* --.
"Morgan" 5th reference, after "SPIE," change "Vo." to -- Vol. --.
"Morgan" 9th reference, change "Frabrication," to -- Fabrication, --.
"Morgan" 17th reference, change "Relability" to -- Reliability --; and after "(SPIE" change ">" to -- < --.
"Young" reference, change "Wuantum" to -- Quantum --.

Column 1,
Line 10, before "technology" change "modem" to -- modern --.
Line 32, after "semiconductor" change "laser which has" to -- lasers which have --.

Column 2,
Line 10, before "performance" remove "a".
Line 26, after "wavelength" change "(110λ)" to -- (10 λ) --.
Line 44, before "providing" change "suggest" to -- suggests --.
Line 64, change "reflectively" to -- reflectivity --.

Column 3,
Line 31, change "optoelectroni" to -- optoelectronic --.
Line 33, change "tha" to -- that --.

Column 7,
Line 7, before "refractive" change "me" to -- the --.

Signed and Sealed this

Seventh Day of February, 2006

JON W. DUDAS
*Director of the United States Patent and Trademark Office*